United States Patent
Jin et al.

(10) Patent No.: US 12,218,657 B2
(45) Date of Patent: Feb. 4, 2025

(54) MILLER CLAMPING DEVICE FOR PARALLEL SWITCHING TRANSISTORS AND DRIVER COMPRISING SAME

(71) Applicant: SANTAK ELECTRONIC (SHENZHEN) CO., LTD., Shenzhen (CN)

(72) Inventors: Dongxin Jin, Shenzhen (CN); Huafen Ouyang, Shenzhen (CN); Lei Cao, Shenzhen (CN); Hualiang Li, Shenzhen (CN); Dawei Zheng, Shenzhen (CN)

(73) Assignee: SANTAK ELECTRONIC (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 18/040,895

(22) PCT Filed: Sep. 3, 2021

(86) PCT No.: PCT/CN2021/116410
§ 371 (c)(1),
(2) Date: Feb. 7, 2023

(87) PCT Pub. No.: WO2022/048629
PCT Pub. Date: Mar. 10, 2022

(65) Prior Publication Data
US 2023/0291399 A1    Sep. 14, 2023

(30) Foreign Application Priority Data
Sep. 4, 2020 (CN) .......................... 202010921177.0

(51) Int. Cl.
  *H03K 17/16* (2006.01)
  *H03K 3/017* (2006.01)

(52) U.S. Cl.
  CPC .......... *H03K 17/162* (2013.01); *H03K 3/017* (2013.01)

(58) Field of Classification Search
  CPC .......................... H03K 17/162; H03K 3/017
  See application file for complete search history.

(56) References Cited

U.S. PATENT DOCUMENTS 6,097,582 A  *  8/2000  John ..................... H03K 17/165
                                                    361/91.6
6,515,531 B2 *  2/2003  Ruff ....................... H03K 17/12
                                                    327/434
(Continued)

FOREIGN PATENT DOCUMENTS

| CN | 204304965 | 4/2015 |
| CN | 107342756 | 11/2017 |

(Continued)

OTHER PUBLICATIONS

International Search Report, PCT/CN2021/116410, mailing date Nov. 30, 2021, 2 pages.
(Continued)

*Primary Examiner* — Ryan Johnson
*Assistant Examiner* — Colleen J O Toole
(74) *Attorney, Agent, or Firm* — Stanek Lemon Crouse & Meeks PA

(57) ABSTRACT

The present invention provides a Miller clamping device for parallel switching transistors and a driver comprising the same. The Miller clamping device includes: a driver chip including an output terminal and a built-in Miller clamping circuit with a Miller clamping terminal, the output terminal of the driver chip being configured to output a pulse width modulation signal; and a plurality of auxiliary Miller clamping circuits, each of the auxiliary Miller clamping circuits being connected between a gate of a corresponding switching transistor and the Miller clamping terminal of the
(Continued)

built-in Miller clamping circuit. When the built-in Miller clamping circuit is triggered for Miller clamping, a Miller current generated by the corresponding switching transistor flows to a first direct-current (DC) voltage through a corresponding auxiliary Miller clamping circuit. The Miller clamping device of the present invention can perform Miller clamping on the parallel switching transistors and reduce the circuit cost.

13 Claims, 6 Drawing Sheets

(56) References Cited

U.S. PATENT DOCUMENTS

| | | | | |
|---|---|---|---|---|
| 7,983,013 | B2* | 7/2011 | Huang | H03K 17/168 |
| | | | | 361/93.1 |
| 10,917,081 | B1* | 2/2021 | Nguyen | H03K 17/18 |
| 2016/0380625 | A1 | 12/2016 | Werker et al. | |
| 2017/0207782 | A1 | 7/2017 | Takizawa | |
| 2021/0336617 | A1 | 10/2021 | Shen et al. | |

FOREIGN PATENT DOCUMENTS

| | | |
|---|---|---|
| CN | 109687693 A | 4/2019 |
| CN | 110829821 | 2/2020 |
| CN | 111464162 | 7/2020 |
| CN | 112003595 | 11/2020 |
| JP | H11262243 | 9/1999 |

OTHER PUBLICATIONS

Ma Lixin et al: "IGBT Driver Circuit Design" Based on 2ED020I12-F2, Electronic Science and Technology, vol. 28, Issue 1. Jan. 15, 2015.

* cited by examiner

MILLER CLAMPING DEVICE FOR PARALLEL SWITCHING TRANSISTORS AND DRIVER COMPRISING SAME

CROSS-REFERENCE TO RELATED APPLICATIONS

The present application claims priority to International Application No. PCT/CN2021/116410 filed on Sep. 3, 2021, published as WO2022/048629 entitled as entitled MILLER CLAMPING DEVICE FOR PARALLEL SWITCHING TRANSISTORS AND DRIVER COMPRISING SAME which claims priority to Chinese Application No. 202010921177.0; Filed Sep. 4, 2020, entitled MILLER CLAMPING DEVICE FOR PARALLEL SWITCHING TRANSISTORS AND DRIVER COMPRISING SAME, the disclosures of which are incorporated herein by reference in their entireties.

TECHNICAL FIELD

The present invention relates to a Miller clamping circuit, and in particular, to a Miller clamping device for parallel switching transistors and a driver comprising the same.

BACKGROUND

A switching transistor (such as an insulated-gate bipolar transistor or a Metal-Oxide-Semiconductor Field-Effect Transistor (MOSFET)) has parasitic Miller capacitance, and the Miller capacitance may lead to a very significant Miller effect, that is, when the switching transistor is controlled to be turned on, Miller capacitance of a switching transistor connected to a same bridge arm as the switching transistor causes the increase in voltage of its gate (i.e. its control electrode), which may cause the accidental turn-on of the switching transistor.

FIG. 1 is a circuit diagram of a driver for an MOSFET in the prior art. The driver includes a driver chip 13 and a driving power amplification device 11, which are powered by a direct-current (DC) power supply 12, wherein an output terminal OUT of the driver chip 13 outputs a pulse width modulation signal PWM, and the driving power amplification device 11 includes an input terminal, a gate output terminal G and a source output terminal S. The gate output terminal G is connected to a gate (or referred to as grid, that is, control electrode) of an MOSFET Q1 by means of a driving resistor Rg11, and the source output terminal S is connected to a source of the MOSFET Q1. The input terminal of the driving power amplification device 11 is configured to receive the pulse width modulation signal PWM and perform power amplification, and the gate output terminal G outputs a power-amplified pulse width modulation driving signal to control turn-on or cut-off of the MOSFET Q1.

As shown in FIG. 1, a drain of the MOSFET Q1 has parasitic drain inductance Ld, the source has parasitic source inductance Ls, and there is a parasitic Miller capacitor Cm between the drain and the gate.

When an MOSFET connected to the same bridge arm as the MOSFET Q1 is controlled to be turned on, a high transient voltage change will occur between the drain and the source of the MOSFET Q1, and a current path of a resulting Miller current is from the drain of the MOSFET Q1, the Miller capacitor Cm, the driving resistor Rg11, the gate output terminal G and the source output terminal S of the driving power amplification device 11 to the source of the MOSFET Q1, so that a Miller voltage is generated across the driving resistor Rg11, resulting in a high voltage drop between the gate and an emitter of the MOSFET Q1. If the voltage drop exceeds an ON threshold of the MOSFET Q1, the MOSFET Q1 may be turned on accidentally.

In order to suppress the Miller effect of the switching transistor, most driver chips in the prior art have built-in Miller clamping circuits to clamp a voltage of a gate of the switching transistor.

FIG. 2 is a circuit block diagram of a driver chip having a built-in Miller clamping circuit in the prior art for performing Miller clamping on a switching transistor. FIG. 2 is substantially the same as FIG. 1, except that a driver chip 23 includes a built-in Miller clamping circuit 231, a Miller clamping terminal CLAMP of the built-in Miller clamping circuit 231 is connected to a gate G2 of a switching transistor Q2, and the built-in Miller clamping circuit 231 is triggered for Miller clamping and serves as a current source for absorbing the Miller current.

When a switching transistor (not shown in FIG. 2) connected to a same bridge arm as the switching transistor Q2 is controlled to be turned on, the driver chip 23 is triggered for Miller clamping at this time, so that the built-in Miller clamping circuit 231 is in a low-resistance state and serves as a current source for absorbing an induced Miller current. That is, the Miller current flows from the gate G2 of the switching transistor Q2 to the Miller clamping terminal CLAMPING of the built-in Miller clamping circuit 231, so that a voltage of the gate G2 of the switching transistor Q2 is clamped to a low level, ensuring that the switching transistor Q2 is in a cut-off state, and preventing the accidental turn-on of the switching transistor Q2.

In a three-phase uninterruptible power supply, a power converter with high power is an application trend. In order to realize the power converter with high power, switching transistors are usually connected in parallel.

FIG. 3 is a circuit block diagram of a driver for parallel switching transistors in the prior art. As shown in FIG. 3, switching transistors Q31, Q32 and Q33 are connected in parallel, that is, sources are connected to one another, and drains are connected to one another. An output terminal OUT of a driver chip 33 outputs a pulse width modulation signal PWM to input terminals of driving power amplification devices 311, 312 and 313, and the driving power amplification devices 311, 312 and 313 are connected to the switching transistors Q31, Q32 and Q33 by means of driving resistors Rg31, Rg32 and Rg33 respectively. A Miller clamping terminal CLAMP of a built-in miller clamping circuit 331 of the driver chip 33 is connected to gates of the switching transistors Q31, Q32 and Q33.

When being triggered for Miller clamping, the built-in Miller clamping circuit 331 is in a low-resistance state and serves as a current source for absorbing a Miller current. In one aspect, the built-in Miller clamping circuit 331 has limited current absorption capability, that is, the built-in Miller clamping circuit can only absorb the Miller current generated by a single switching transistor, but cannot absorb Miller currents generated by multiple switching transistors connected in parallel. In another aspect, transmission paths from the driver chip 33 to the driving power amplification devices 311, 312 and 313 are different, and resistance values between the driving power amplification devices 311, 312 and 313 and the switching transistors Q31, Q32 and Q33 are different, thereby possibly causing asynchronous ON/OFF of the switching transistors Q31, Q32 and Q33, and then causing damage of the switching transistors Q31, Q32 and Q33. In yet another aspect, current paths from the Miller clamping terminal CLAMP to the gates of the switching transistors Q31, Q32 and Q33 are usually long, thereby having certain equivalent resistance. The Miller current may still generate a certain voltage drop in the equivalent resistance, which may cause a voltage drop between the gates and sources of the switching transistors Q31, Q32 and Q33 to be greater than an ON threshold voltage of the switching transistors, thus weakening the Miller clamping performance.

Therefore, the existing driver chip cannot effectively perform Miller clamping on the parallel switching transistors.

SUMMARY

In view of the above-mentioned technical problems existing in the prior art, the embodiments of the present invention provide a Miller clamping device for parallel switching transistors, the Miller clamping device includes:
  a driver chip including an output terminal and a built-in Miller clamping circuit with a Miller clamping terminal, wherein the output terminal of the driver chip is configured to output a pulse width modulation signal; and
  a plurality of auxiliary Miller clamping circuits, each of the auxiliary Miller clamping circuits is connected between a gate of a corresponding switching transistor and the Miller clamping terminal of the built-in Miller clamping circuit;
  wherein when the built-in Miller clamping circuit is triggered for Miller clamping, a Miller current generated by the corresponding switching transistor flows to a first direct-current (DC) voltage through a corresponding auxiliary Miller clamping circuit.

Preferably, each of the auxiliary Miller clamping circuits includes: a controllable transistor including a control electrode, a first electrode and a second electrode, wherein the control electrode of the controllable transistor is connected to the Miller clamping terminal of the built-in Miller clamping circuit, and the second electrode is connected to the first DC voltage; a first diode, wherein a positive electrode of the first diode is connected to a gate of the corresponding switching transistor, and a negative electrode of the first diode is connected to a second DC voltage; and a second diode, wherein a positive electrode of the second diode is connected to the positive electrode of the first diode, and a negative electrode of the second diode is connected to the first electrode of the controllable transistor; wherein the second DC voltage is greater than the first DC voltage; and when the built-in Miller clamping circuit is triggered for Miller clamping, the controllable transistor is conducted between the first electrode and the second electrode.

Preferably, the built-in Miller clamping circuit is a current source for absorbing the Miller current, and the controllable transistor is a first PNP-type triode or a P-type Metal-Oxide-Semiconductor Field-Effect Transistor (MOSFET); a base of the first PNP-type triode or a gate of the P-type MOSFET is connected to the Miller clamping terminal of the built-in Miller clamping circuit, an emitter of the first PNP-type triode or a source of the P-type MOSFET is connected to the gate of the corresponding switching transistor, and a collector of the first PNP-type triode or a drain of the P-type MOSFET is connected to the first DC voltage; and each of the auxiliary Miller clamping circuits further includes a first resistor connected between the Miller clamping terminal and the emitter of the first PNP-type triode or the source of the P-type MOSFET.

Preferably, each of the Miller clamping circuits further includes a second resistor connected between the Miller clamping terminal and the base of the first PNP-type triode or the gate of the P-type MOSFET.

Preferably, each of the auxiliary Miller clamping circuits further includes a first capacitor connected between the base and emitter of the first PNP-type triode or between the gate and source of the P-type MOSFET.

Preferably, the driver further includes a pulse width modulation signal locking device connected between the output terminal of the driver chip and the Miller clamping terminal, and the pulse width modulation signal locking device is configured to lock an electrical potential of the Miller clamping terminal.

Preferably, the pulse width modulation signal locking device includes a third diode and a third resistor which are connected in series.

Preferably, the built-in Miller clamping circuit is a voltage source that outputs a Miller enable signal; the controllable transistor is a first NPN-type triode or an N-type MOSFET, a base of the first NPN-type triode or a gate of the N-type MOSFET is connected to the Miller clamping terminal of the built-in Miller clamping circuit, a collector of the first NPN-type triode or a drain of the N-type MOSFET is connected to the gate of the corresponding switching transistor, and an emitter of the first NPN-type triode or a source of the N-type MOSFET is connected to the first DC voltage.

Preferably, each of the auxiliary Miller clamping circuits further includes a fourth resistor connected between the Miller clamping terminal and the base of the NPN-type triode or the gate of the N-type MOSFET.

Preferably, each of the auxiliary Miller clamping circuits further includes a second capacitor connected between the base and collector of the first NPN-type triode or between the gate and drain of the N-type MOSFET.

Preferably, each of the auxiliary Miller clamping circuits further includes a fourth diode connected between the positive electrode of the first diode and the collector of the first NPN-type triode or the drain of the N-type MOSFET.

Preferably, each of the auxiliary Miller clamping circuits is close to the gate of the corresponding switching transistor.

The present invention provides a driver, including:
  the Miller clamping device for the parallel switching transistors as described above; and
  a plurality of driving power amplification devices, each of the driving power amplification devices including an input terminal, a gate output terminal and a source output terminal, wherein the input terminal is connected to an output terminal of a driver chip in the Miller clamping device, the gate output terminal is connected to a gate of a corresponding switching transistor by means of a driving resistor, the source output terminal is connected to a source of the corresponding switching transistor, and each of the driving power amplification devices is configured to power amplify a pulse width modulation signal output by the driver chip.

Preferably, each of the driving power amplification devices includes: a second NPN-type triode and a second PNP-type triode, wherein a base of the second NPN-type triode and a base of the second PNP-type triode are connected to the output terminal of the driver chip, a collector of the second NPN-type triode is connected to a third DC voltage, a collector of the second PNP-type triode is connected to a fourth DC voltage, a emitter of the second NPN-type triode and a emitter of the second PNP-type triode are connected with each other to serve as a gate output terminal of the driving power amplification device, and the third DC voltage is greater than the fourth DC voltage; and three capacitors, wherein one ends of the three capacitors are connected to the third DC voltage, the fourth DC voltage and the gate output terminal respectively, and the other ends are connected with each other to serve as a source output terminal of the driving power amplification device.

By means of the Miller clamping device of the present invention, the gates of the parallel switching transistors are isolated from each other, Miller clamping on the parallel switching transistors is realized, and the current absorption capability of the built-in Miller clamping circuit of the driver chip is amplified, thereby saving the circuit cost, reducing Miller current conduction paths and equivalent resistance in the Miller current conduction paths, and improving the Miller clamping effect.

BRIEF DESCRIPTION OF THE DRAWINGS

The embodiments of the present invention will be further described below with reference to the accompanying drawings, in which.

DETAILED DESCRIPTION

In order to make the objects, technical solutions and advantages of the present invention clearer, the present invention will be further described in detail with reference to the drawings and specific embodiments.

For the convenience of the following description, the high level and the low level defined below are technical concepts or terms well known in the field of analog circuits or digital circuits. For example, the high level may be a voltage of 5V, 12V or 24V, and the low level may be a voltage of less than IV or a negative voltage lower than a logical or actual ground voltage.

Figure 1:
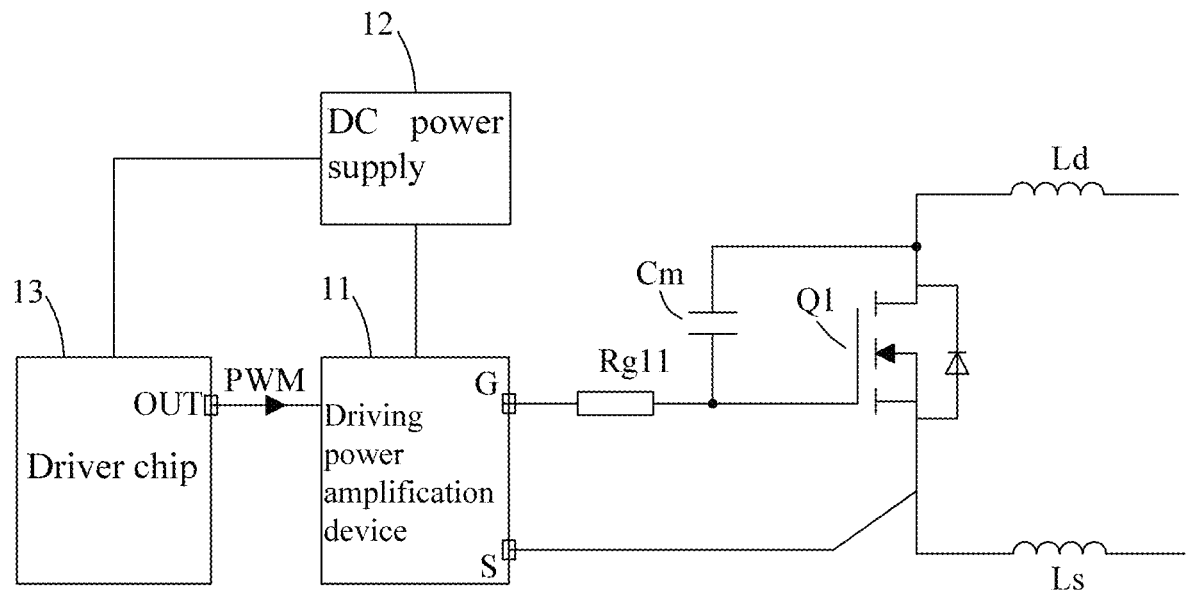
FIG. 1 is a circuit diagram of a driver for a Metal-Oxide-Semiconductor Field-Effect Transistor in the prior art.
Figure 2:
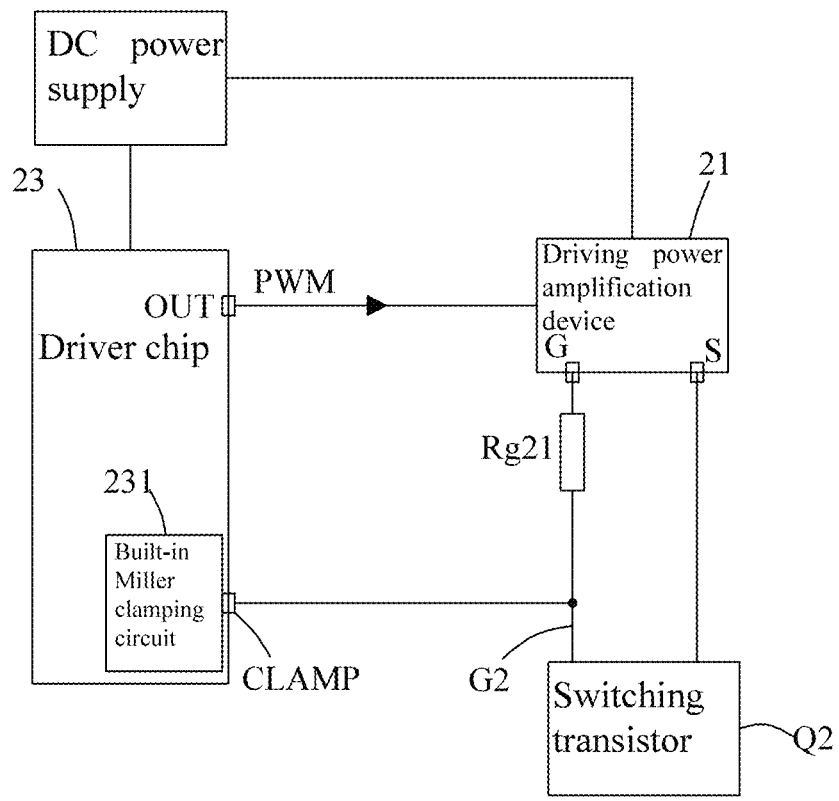
FIG. 2 is a circuit block diagram of a driver chip having a built-in Miller clamping circuit in the prior art for performing Miller clamping on a switching transistor.
Figure 3:
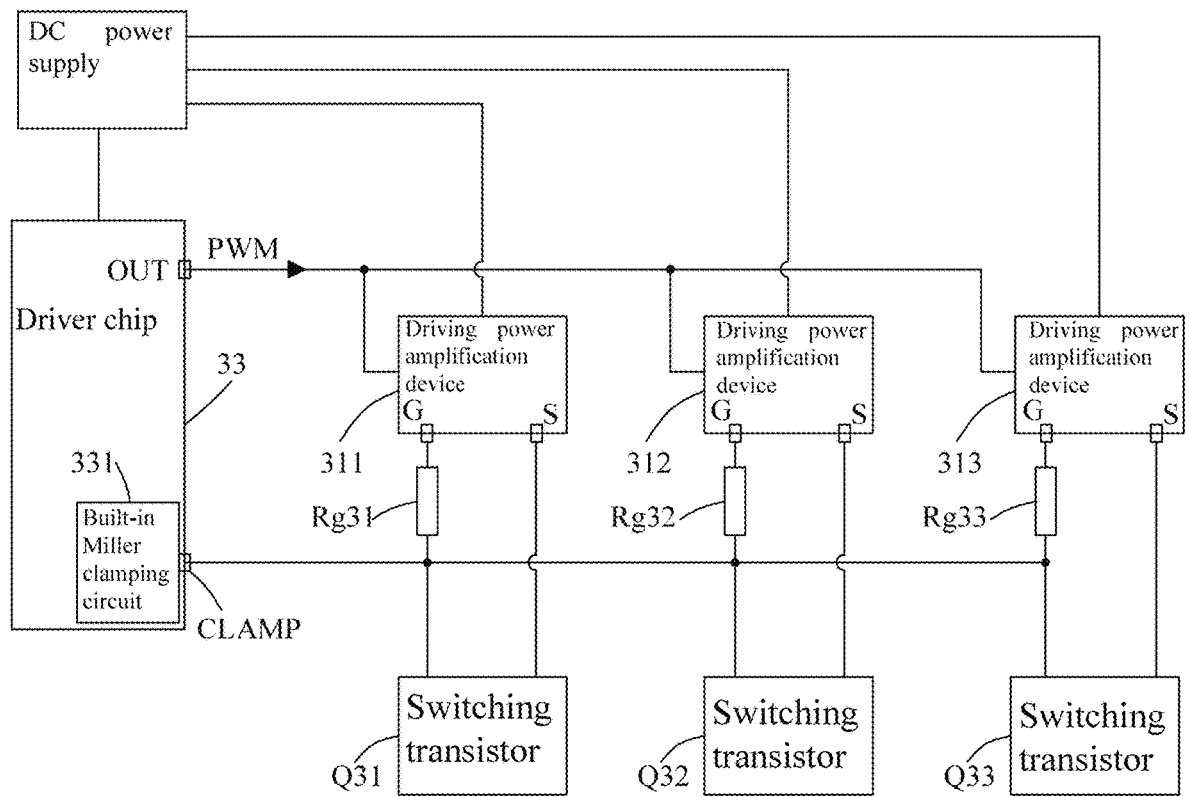
FIG. 3 is a circuit block diagram of a driver for parallel switching transistors in the prior art.
Figure 4:
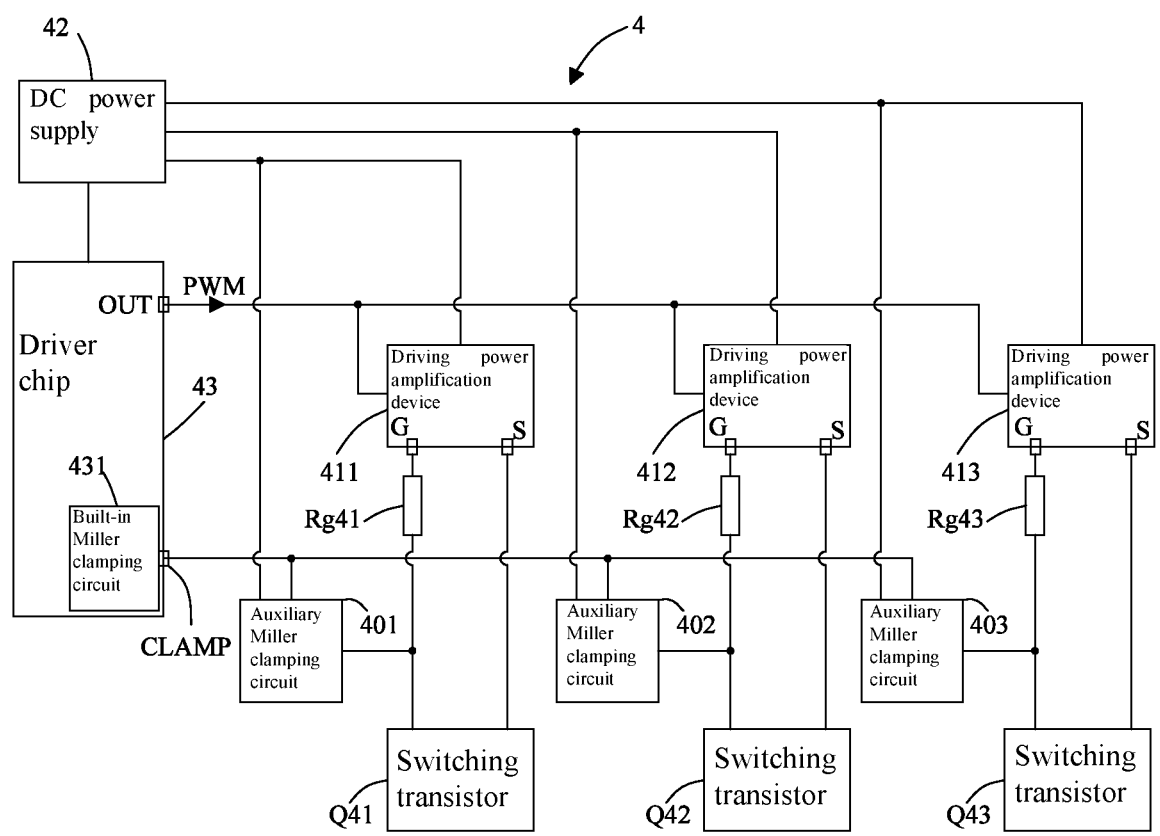
FIG. 4 is a block diagram of a driver for parallel switching transistors according to a preferred embodiment of the present invention.

FIG. 4 is a block diagram of a driver for parallel switching transistors according to a preferred embodiment of the present invention. As shown in FIG. 4, a driver 4 is substantially the same as a driver shown in FIG. 3, except that the driver 4 further includes an auxiliary Miller clamping circuit 401, an auxiliary Miller clamping circuit 402 and an auxiliary Miller clamping circuit 403, wherein the auxiliary Miller clamping circuit 401 is connected between a gate of a switching transistor Q41 and a Miller clamping terminal CLAMP of a built-in Miller clamping circuit 431 of a driver chip 43; the auxiliary Miller clamping circuit 402 is connected between a gate of a switching transistor Q42 and the Miller clamping terminal CLAMP of the Miller clamping circuit 431; and the auxiliary Miller clamping circuit 403 is connected between a gate of a switching transistor Q43 and the Miller clamping terminal CLAMP of the Miller clamping circuit 431. A direct-current (DC) power supply 42 is used for providing the same DC voltage to the auxiliary Miller clamping circuit 401 and a driving power amplification device 411, providing the same DC voltage to the auxiliary Miller clamping circuit 402 and a driving power amplification device 412, and providing the same DC voltage to the auxiliary Miller clamping circuit 403 and a driving power amplification device 413.

When a pulse width modulation signal PWM output by an output terminal OUT of the driver chip 43 is at a high level, the driving power amplification devices 411, 412 and 413 respectively power amplify the pulse width modulation signal PWM to output pulse width modulation driving signals, and the pulse width modulation driving signals are output to the gates of the switching transistors Q41, Q42 and Q43 through driving resistors Rg41, Rg42 and Rg43 respectively, thereby controlling the switching transistors Q41, Q42 and Q43 to be turned on.

When the pulse width modulation signal output by the output terminal OUT of the driver chip 43 is at a low level, the driving power amplification devices 411, 412 and 413 respectively output the low level to the switching transistors, and Miller currents generated by the switching transistors Q41, Q42 and Q43 are output to the gates of the switching transistors Q41, Q42 and Q43 through parasitic Miller capacitors (not shown in FIG. 4). At this time, when the built-in Miller clamping circuit 431 is triggered for Miller clamping, conduction paths are formed in the auxiliary Miller clamping circuits 401, 402 and 403, so that the Miller currents generated by the switching transistors Q41. Q42 and Q43 flow from the gates of the switching transistors Q41, Q42 and Q43 to low-level DC voltages through the auxiliary Miller clamping circuits 401, 402 and 403 respectively.

A current path of the Miller currents is not formed between the gate and source of each of the switching transistors Q41, Q42 and Q43, so the switching transistors Q41, Q42 and Q43 are kept in a cut-off state and may not be turned on accidentally. Therefore, an auxiliary Miller clamping device 40 of the present invention may be used for performing Miller clamping on a plurality of parallel switching transistors.

The auxiliary Miller clamping circuits 401, 402 and 403 isolate the gates of the switching transistors Q41. Q42 and Q43 from one another, thus avoiding the damage of the switching transistors caused by asynchronous ON/OFF of the switching transistors Q41, Q42 and Q43.

On a circuit board, the auxiliary Miller clamping circuits 401, 402 and 403 may be arranged close to the switching transistors Q41, Q42 and Q43 respectively, thereby shortening the current paths of the Miller currents generated by the switching transistors Q41, Q42 and Q43 and improving the Miller clamping performance.

Figure 5:
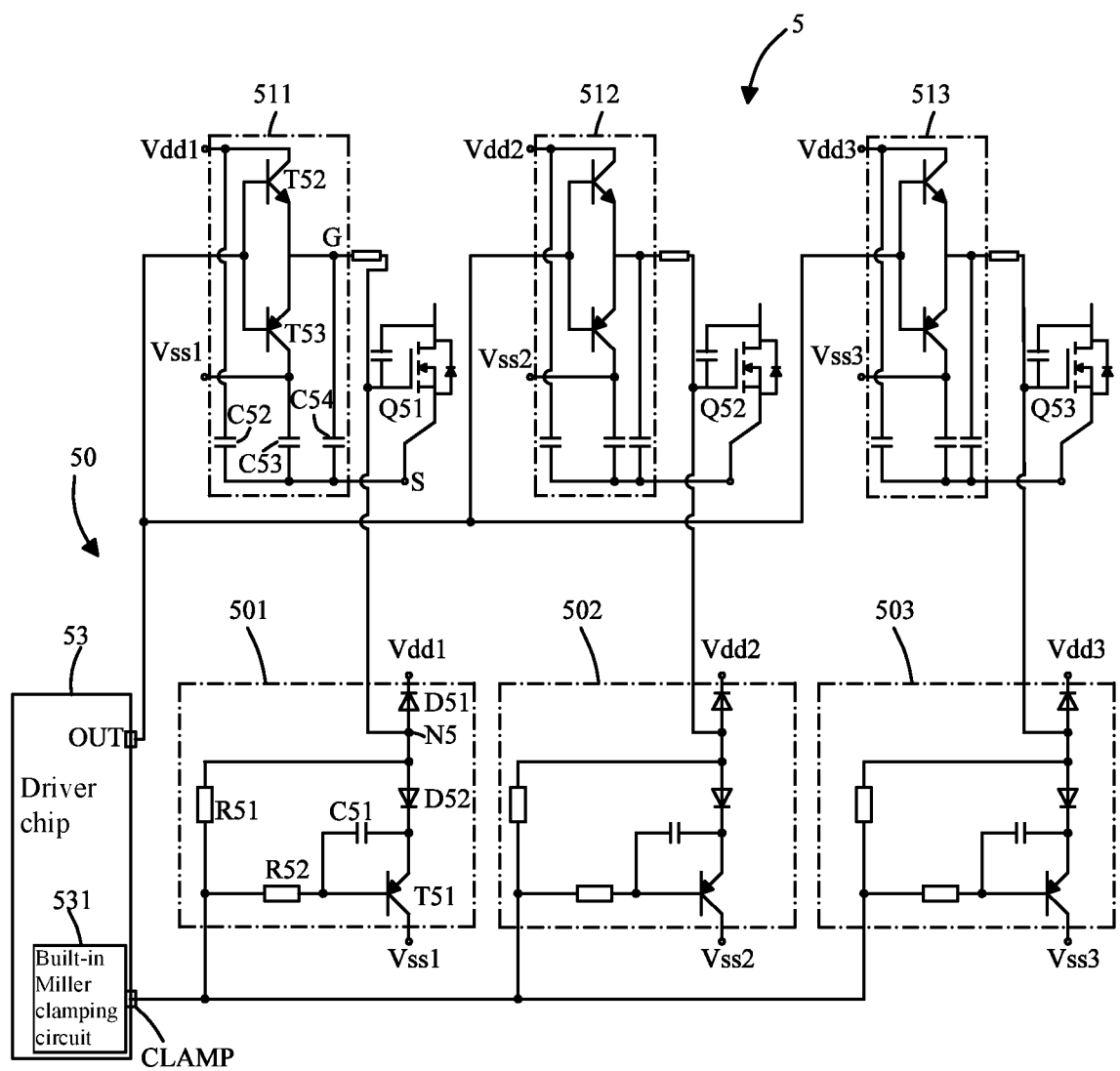
FIG. 5 is a circuit diagram of a driver for parallel switching transistors according to a second embodiment of the present invention.

FIG. 5 is a circuit diagram of a driver for parallel switching transistors according to a second embodiment of the present invention. As shown in FIG. 5, a driver 5 includes driving power amplification devices 511, 512 and 513, and a Miller clamping device 50. The Miller clamping device 50 includes a driver chip 53 and auxiliary Miller clamping circuits 501, 502 and 503. An output terminal OUT of the driver chip 53 is connected to input terminals of the driving power amplification devices 511, 512 and 513; the auxiliary Miller clamping circuit 501 is connected between a Miller clamping terminal CLAMP of a built-in Miller clamping circuit 531 of a driver chip 53 and a gate of an MOSFET Q51; the auxiliary Miller clamping circuit 502 is connected between the Miller clamping terminal CLAMP of the built-in Miller clamping circuit 531 and a gate of an MOSFET Q52; and the auxiliary Miller clamping circuit 503 is connected between the Miller clamping terminal CLAMP of the built-in Miller clamping circuit 531 and a gate of an MOSFET Q53.

A DC power supply (not shown in FIG. 5) provides a high-level DC voltage Vdd1 and a low-level DC voltage Vss1 to each of the driving power amplification device 511 and the auxiliary Miller clamping circuit 501, provides a high-level DC voltage Vdd2 and a low-level DC voltage Vss2 to each of the driving power amplification device 512 and the auxiliary Miller clamping circuit 502, and provides a high-level DC voltage Vdd3 and a low-level DC voltage Vss3 to each of the driving power amplification device 513 and the auxiliary Miller clamping circuit 503. Voltage values of the high-level DC voltages Vdd1, Vdd2 and Vdd3 are equal, and voltage values of the low-level DC voltages Vss1, Vss2 and Vss3 are equal.

The auxiliary Miller clamping circuits 501, 502 and 503 have the same circuit structure. Here, only the auxiliary Miller clamping circuit 501 is taken as an example for introduction. The auxiliary Miller clamping circuit 501 includes a PNP-type triode T51, a resistor R51, a resistor R52, a capacitor C51, a diode D51 and a diode D52, wherein the capacitor C51 is connected between an emitter and a base of the PNP-type triode T51; the resistor R51 is connected between the Miller clamping terminal CLAMP of the built-in Miller clamping circuit 531 and an emitter of the PNP-type triode T51; the resistor R52 is connected between the Miller clamping terminal CLAMP of the built-in Miller clamping circuit 531 and the base of the PNP-type triode T51; a collector of the PNP-type triode T51 is connected to the low-level DC voltage Vss1; a node formed by connecting a positive electrode of the diode D51 with a positive electrode of the diode D52 is connected to the gate of the MOSFET Q51, a negative electrode of the diode D51 is connected to the high-level DC voltage Vdd1, and a negative electrode of the diode D52 is connected to the emitter of the PNP-type triode T51.

The driving power amplification devices 511, 512 and 513 have the same circuit structure. Here, only the driving power amplification device 511 is taken as an example for introduction. The driving power amplification device 511 includes an NPN-type triode T52 and a PNP-type triode T53 as well as capacitors C52, C53 and C54, wherein the NPN-type triode T52 and the PNP-type triode T53 are connected into a push-pull structure, that is, a base of the NPN-type triode T52 and a base of the PNP-type triode T53 are both connected to the output terminal OUT of the driver chip 53; a collector of the NPN-type triode T52 is connected to the DC voltage Vdd1; a collector of the PNP-type triode T53 is connected to the DC voltage Vss1; and a node formed by connecting an emitter of the PNP-type triode T53 with an emitter of the NPN-type triode T52 is used as a gate output terminal of the driving power amplification device 511. One ends of the capacitors C52, C53, C54 are connected with each other to serve as a source output terminal S of the driving power amplification device 511, and the other ends are connected to the DC voltages Vdd1. Vss1 and the gate output terminal G respectively. The capacitors C52, C53, and C54 are used for voltage stabilization, which prevents the high level of the pulse width modulation drive signal output by the driving power amplification device 511 from decreasing.

When the pulse width modulation signal output by the output terminal OUT of the driver chip 53 is at a high level (i.e., greater than a turn-on voltage of a triode), the NPN-type triode T52 is turned on, and the PNP-type triode T53 is cut off. At this time, a voltage of the gate output terminal G of the driving power amplification device 511 is equal to or slightly smaller than the DC voltage Vdd1, and the current is greater than a base current, so the high level output by the driving power amplification device 511 controls the MOSFET Q51 to be turned on.

When the pulse width modulation signal output by the output terminal OUT of the driver chip 53 is at a low level (i.e., less than the turn-on voltage of the triode), the NPN-type triode T52 is cut off, and the PNP-type triode T53 is turned on. At this time, the voltage of the gate output terminal G of the driving power amplification device 511 is equal to or roughly equal to the DC voltage Vss1, so the low level output by the driving power amplification device 511 controls the MOSFET Q51 to be cut off. At this time, the Miller current generated by the MOSFET Q51 flows from the drain to the gate through a Miller capacitor, and then flows to a node N5 formed by connecting the positive electrodes of the diode D51 and the diode D52 in the auxiliary Miller clamping circuit 501. Because the built-in Miller clamping circuit 531 is triggered to be in a low-resistance state when the output terminal OUT outputs a low level and is used for absorbing a Miller current, a small amount of current will flow through the resistor R51 to generate a voltage drop across the resistor R51, and the voltage drop across the resistor R51 is greater than a sum of a positive bias voltage of an emitter junction of the PNP-type triode T51 and a turn-on voltage of the diode D52. Therefore, the PNP-type triode T51 is turned on, and the Miller current flows from the node N5 to the DC voltage Vss1 through the diode D52 and the PNP-type triode T51 which is in a turn-on state.

According to the above-mentioned Miller clamping principle, a very small part of the Miller currents generated by the MOSFETs Q51, Q52 and Q53 flow into the built-in Miller clamping circuit 531, and the vast majority of the Miller currents flow to the DC voltages Vss1, Vss2 and Vss3 respectively through the turned-on auxiliary Miller clamping circuits 501, 502 and 503. The auxiliary Miller clamping circuits 501, 502 and 503 amplify the current absorption capability of the built-in Miller clamping circuit 531, so only one driver chip 53 is adopted to absorb the Miller currents generated by a plurality of parallel MOSFETs. Compared with the Miller clamping device adopting a plurality of driver chips 53, the Miller clamping device 50 of the present invention saves the circuit cost.

The gates of the parallel MOSFETs Q51, Q52 and Q53 are isolated from one another, so the MOSFETs Q51, Q52 and Q53 may not be damaged due to asynchronous ON/OFF of the MOSFETs Q51, Q52 and Q53.

When the auxiliary Miller clamping circuits 501, 502, 503 are arranged on the circuit board, the auxiliary Miller clamping circuits 501, 502, 503 may be made close to the gates of the switching transistors Q51, Q52 and Q53, thereby reducing Miller current conduction paths, then reducing equivalent resistance in the Miller current conduction paths, improving the Miller clamping effect, and ensuring that the MOSFETs Q51, Q52 and Q53 may not be turned on accidentally.

The resistor R51 may be used as a voltage dividing resistor with a larger resistance value (for example, several thousand ohms), and a voltage across the resistor is greater than the positive bias voltage of the emitter junction of the PNP-type triode T51, to enable the PNP-type triode T51 to be turned on. The resistor R52 may be used as a base current limiting resistor with a smaller resistance value (for example, several ohms to tens of ohms) to prevent a damage on the PNP-type triode T51 due to an excessive base current.

The capacitor C51 may be used as a high-frequency negative feedback capacitor with an appropriate capacitance value, to improve the stability of the PNP-type triode T51 and avoid high-frequency parasitic oscillation.

The diode D51 is used for clamping a gate voltage of the MOSFET Q51. If the gate voltage of the MOSFET Q51 is much greater than the DC voltage Vdd1, the diode D51 is turned on, thus clamping the gate voltage of the MOSFET Q51 to a sum of the DC voltage Vdd1 and the turn-on voltage of the diode D51. The diode D52 is connected between the emitter of the PNP-type triode T51 and the gate of the MOSFET Q51, to prevent the situation that an emitter current of the PNP-type triode T51 reversely flows into the gate of the MOSFET Q51, and then affects the ON/OFF state or causes a damage on the MOSFET Q51.

Figure 6:
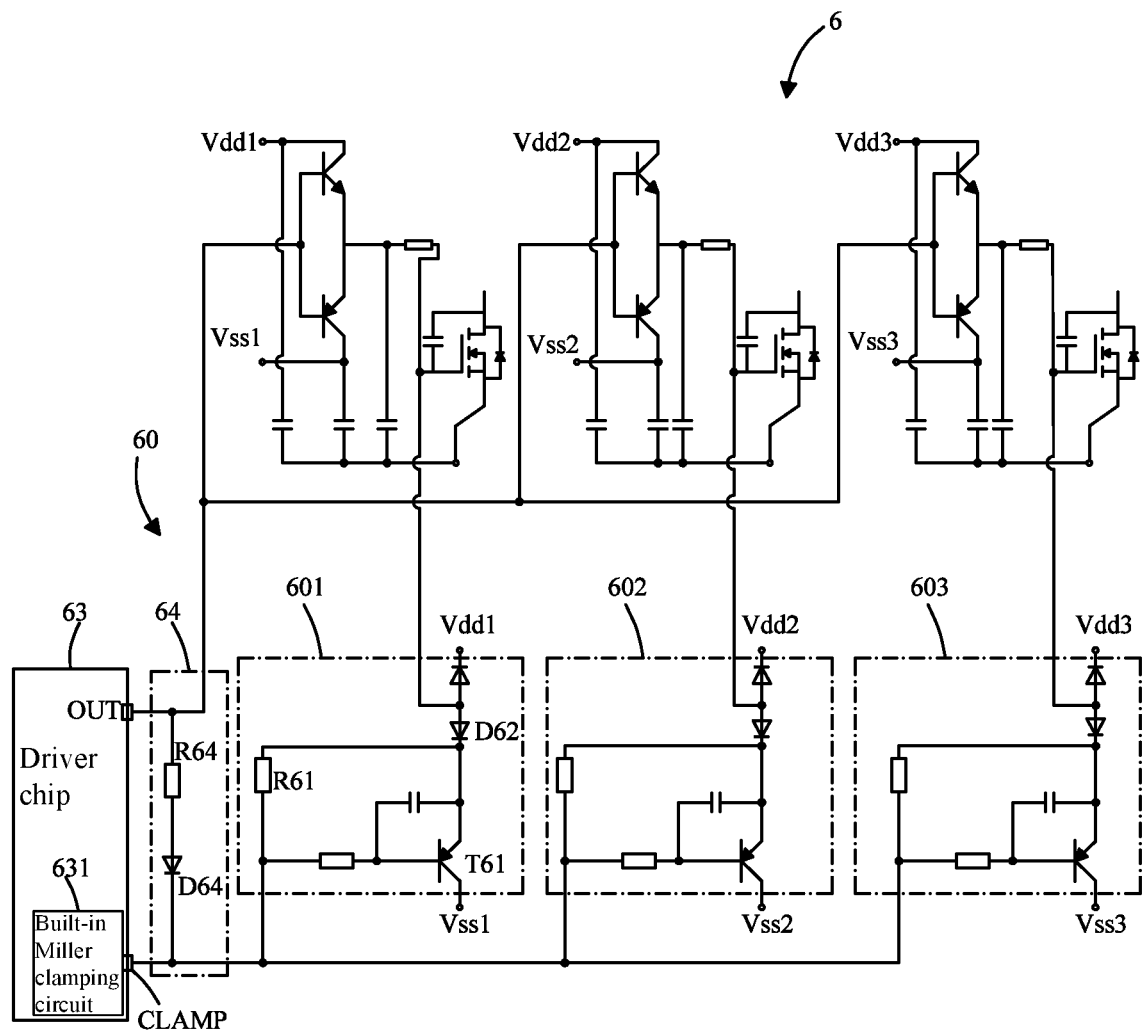
FIG. 6 is a circuit diagram of a driver for parallel switching transistors according to a third embodiment of the present invention.

FIG. 6 is a circuit diagram of a driver for parallel switching transistors according to a third embodiment of the present invention. As shown in FIG. 6, a driver 6 is substantially the same as the driver 5 shown in FIG. 5, except that a Miller clamping device 60 further includes a pulse width modulation signal locking device 64 connected between an output terminal OUT of a driver chip 63 and a Miller clamping terminal CLAMP of a built-in Miller clamping circuit 631. One end of a resistor R61 in an auxiliary Miller clamping circuit 601 is connected to the Miller clamping terminal CLAMP of the built-in Miller clamping circuit 631, and the other end is connected to a node formed by connecting a negative electrode of a diode D62 with an emitter of a PNP-type triode T61. Auxiliary Miller clamping circuits 602 and 603 are the same as the auxiliary Miller clamping circuit 601, which will not be repeated here.

The pulse width modulation signal locking device 64 includes a resistor R64 and a diode D64 which are connected in series. When a pulse width modulation signal output by the output terminal OUT of the driver chip 63 is at a low level VL, the Miller clamping terminal CLAMP is triggered to be in a low-resistance state, and a conduction path is formed by the resistor R64 and the diode D64, so that a voltage of the Miller clamping terminal CLAMP is less than VL minus a voltage drop of the diode D64. Thus, the voltage of the Miller clamping terminal CLAMP is clamped at a low level, to prevent the situation that an electrical potential of the Miller clamping terminal CLAMP is changed by signal interference to affect the ON/OFF state of the PNP-type triode T61, and to further prevent the parallel MOSFETs from being turned on accidentally.

Figure 7:
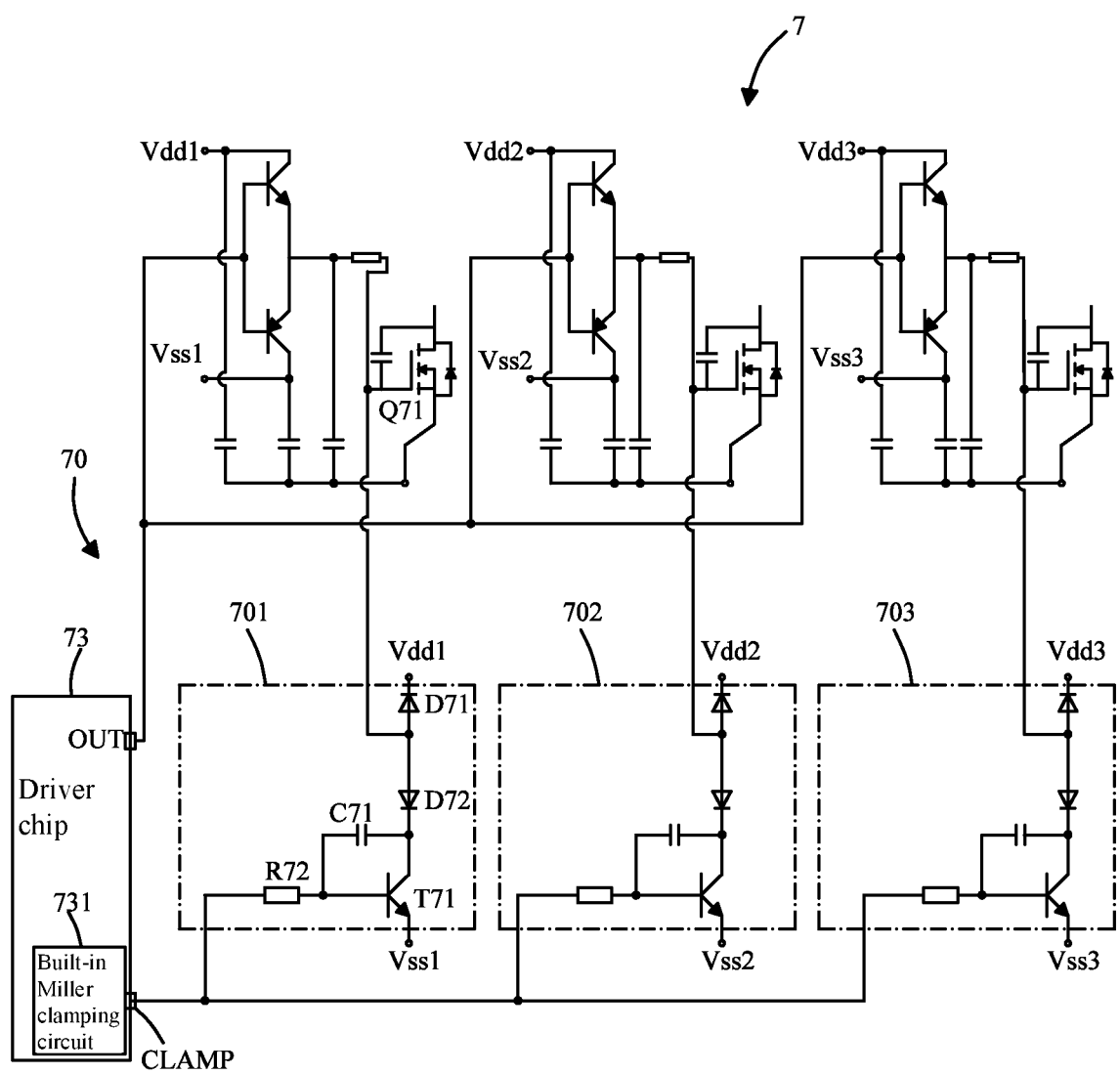
FIG. 7 is a circuit diagram of a driver for parallel switching transistors according to a fourth embodiment of the present invention.

FIG. 7 is a circuit diagram of a driver for parallel switching transistors according to a fourth embodiment of the present invention. As shown in FIG. 7, a driver 7 is substantially the same as the driver 5 shown in FIG. 5, except that a Miller clamping device 70 includes a driver chip 73 and identical auxiliary Miller clamping circuits 701, 702 and 703. A built-in Miller clamping circuit 731 of the driver chip 73 is a voltage source configured to output a high-level Miller enable signal. Each of the auxiliary Miller clamping circuits 701, 702, and 703 adopts an NPN-type triode instead of the PNP-type triode in the auxiliary Miller clamping circuit 501, 502, or 503, and omits a resistor connected between a positive electrode or negative electrode of a diode D72 and a Miller clamping terminal CLAMP of the built-in Miller clamping circuit 731.

Specifically, the auxiliary Miller clamping circuit 701 includes an NPN-type triode T71, diodes D71 and D72, a resistor R72 and a capacitor C71, wherein the capacitor C71 is connected between a base and a collector of the NPN-type triode T71; the resistor R72 is connected between the base of the NPN-type triode T71 and the Miller clamping terminal CLAMP of the Miller clamping circuit 731; a negative electrode of diode D71 is connected to a high-level DC voltage Vdd1; a node formed by connecting a positive electrode of the diode D71 with a positive electrode of the diode D72 is connected to a gate of an MOSFET Q71; a negative electrode of the diode D72 is connected to the collector of the NPN-type triode T71; and an emitter of the NPN-type triode T71 is connected to a low-level DC voltage.

When an MOSFET (not shown in FIG. 7) connected to a same bridge arm as the MOSFET Q71 is controlled to be turned on, a Miller current generated by the MOSFET Q71 flows from a drain to a gate of the MOSFET Q71 through a parasitic Miller capacitor, and a Miller clamping circuit 831 outputs a high-level Miller enable signal at the same time, so that an emitter junction of the NPN-type triode T71 is forward biased. Thus, the NPN-type triode T71 is turned on, the Miller current flows from the gate of the MOSFET Q71 to the low-level DC voltage Vss1 through the diode D72 and the turned-on NPN-type triode T71 in sequence. Therefore, no voltage drop is generated between the gate and the source of the MOSFET Q71, preventing the MOSFET Q71 from being turned on accidentally.

In another embodiment of the present invention, the Miller clamping device 50 further includes the pulse width modulation signal locking device 64 in FIG. 6.

In other embodiments of the present invention, controllable transistors such as P-type MOSFET, etc. may be adopted instead of the PNP-type triodes in the auxiliary Miller clamping circuits 501, 502, 503 in FIG. 5 or the PNP-type triodes in the auxiliary Miller clamping circuits 601, 602, 603 in FIG. 6, wherein a gate of the P-type MOSFET is a control electrode, a source is connected to a gate of a corresponding switching transistor, and a drain is connected to a low-level DC voltage. In other embodiments of the present invention, controllable transistors such as N-type MOSFET, etc. may be adopted instead of NPN-type triodes in the auxiliary Miller clamping circuits 701, 702, 703 in FIG. 7, wherein a gate of the N-type MOSFET is a control electrode, a drain is connected to a gate of a corresponding switching transistor, and a source is connected to a low-level DC voltage. The MOSFET has a faster ON/OFF speed and can achieve better dynamic performance.

The Miller clamping device of the present invention can also be used for Miller clamping switching transistors such as multiple insulated gate bipolar transistors connected in parallel, etc. The number of the switching transistors connected in parallel is not limited to three, and may be more or less than three.

For the driver of the present invention, various models and types of driving power amplification devices may be selected, and various driving power amplification devices capable of performing power amplification on the pulse width modulation signal in the prior art may be selected.

For the Miller clamping device of the present invention, various models and types of driver chips having the built-in Miller clamping circuits may be selected.

Although the present invention has been described in terms of the preferred embodiments, the present invention is not limited to the embodiments described herein, and various variations and changes can be made without departing from the scope of the present invention.

The invention claimed is:

1. An apparatus comprising:
a driver chip comprising an output terminal and a built-in clamping circuit with a clamping terminal, the output terminal of the driver chip being configured to output a pulse width modulation signal; and
a plurality of auxiliary clamping circuits, respective ones of the auxiliary clamping circuits being connected between gates of respective switching transistors and the clamping terminal of the built-in clamping circuit;
wherein when the built-in clamping circuit is triggered, a respective currents generated by the respective switching transistors flow through respective ones of the auxiliary clamping circuits.

2. The apparatus of claim 1, wherein each of the auxiliary clamping circuits comprises:
a controllable transistor comprising a control electrode, a first electrode and a second electrode, a control electrode of the controllable transistor being connected to the clamping terminal of the built-in clamping circuit, and the second electrode being connected to a first DC node having a first DC voltage;
a first diode, a positive electrode of the first diode being connected to a gate of the corresponding switching transistor, and a negative electrode of the first diode being connected to a second DC node having a second DC voltage; and
a second diode, a positive electrode of the second diode being connected to the positive electrode of the first diode, and a negative electrode of the second diode being connected to the first electrode of the controllable transistor;
wherein the second DC voltage is greater than the first DC voltage and, when the built-in clamping circuit is triggered, the controllable transistor conducts between the first electrode and the second electrode.

3. The apparatus of claim 2:
wherein the built-in clamping circuit is a current source and the controllable transistor is a first PNP-type triode or a P-type Metal-Oxide-Semiconductor Field-Effect Transistor (MOSFET);
wherein a base of the first PNP-type triode or a gate of the P-type MOSFET is connected to the clamping terminal of the built-in clamping circuit, an emitter of the first PNP-type triode or a source of the P-type MOSFET is connected to the gate of the corresponding switching transistor, and a collector of the first PNP-type triode or a drain of the P-type MOSFET is connected to the first DC voltage; and
wherein each of the auxiliary clamping circuits further comprises a first resistor connected between the clamping terminal and the emitter of the first PNP-type triode or the source of the P-type MOSFET.

4. The apparatus of claim 3, wherein each of the clamping circuits further comprises a second resistor connected between the Previously Presented clamping terminal and the base of the first PNP-type triode or the gate of the P-type MOSFET.

5. The apparatus of claim 3, wherein each of the auxiliary clamping circuits further comprises a first capacitor connected between the base and the emitter of the first PNP-type triode or between the gate and the source of the P-type MOSFET.

6. The apparatus of claim 3, wherein the driver further comprises a pulse width modulation signal locking device connected between the output terminal of the driver chip and the clamping terminal, the pulse width modulation signal locking device configured to lock an electrical potential of the clamping terminal.

7. The apparatus of claim 6, wherein the pulse width modulation signal locking device comprises a third diode and a third resistor connected in series.

8. The apparatus of claim 2:
wherein the built-in clamping circuit is a voltage source that outputs an enable signal; and
wherein the controllable transistor is a first NPN-type triode or an N-type MOSFET, a base of the first NPN-type triode or a gate of the N-type MOSFET is connected to the clamping terminal of the built-in clamping circuit, a collector of the first NPN-type triode or a drain of the N-type MOSFET is connected to the gate of the corresponding switching transistor, and an emitter of the first NPN-type triode or a source of the N-type MOSFET is connected to the first DC node.

9. The apparatus of claim 8, wherein each of the auxiliary clamping circuits further comprises a fourth resistor connected between the clamping terminal and the base of the NPN-type triode or the gate of the N-type MOSFET.

10. The apparatus of claim 8, wherein each of the auxiliary clamping circuits further comprises a second capacitor connected between the base and the collector of the first NPN-type triode or between the gate and the drain of the N-type MOSFET.

11. The apparatus of claim 8, wherein each of the auxiliary clamping circuits further comprises a fourth diode connected between the positive electrode of the first diode and the collector of the first NPN-type triode or the drain of the N-type MOSFET.

12. A driver, comprising:
the apparatus of claim 1; and
a plurality of driving power amplification devices, each of the driving power amplification devices comprising an input terminal, a gate output terminal and a source output terminal, wherein the input terminal is connected to an output terminal of the driver chip, wherein the gate output terminal is connected to a gate of a corresponding switching transistor by means of a driving resistor, wherein the source output terminal is connected to a source of the corresponding switching transistor, and wherein each of the driving power amplification devices is configured to amplify the pulse width modulation signal output by the driver chip.

13. The driver of claim 12, wherein each of the driving power amplification devices comprises:
a second NPN-type triode and a second PNP-type triode, wherein a base of the second NPN-type triode and a base of the second PNP-type triode are connected to the output terminal of the driver chip, wherein a collector of the second NPN-type triode is connected to a third DC node, wherein a collector of the second PNP-type triode is connected to a fourth DC node, wherein an emitter of the second NPN-type triode and a emitter of the second PNP-type triode are connected in common to serve as the gate output terminal of the driving power amplification device, and wherein a third DC voltage of the third DC node is greater than a fourth DC voltage of the fourth DC node; and three capacitors, wherein first terminals of the three capacitors are connected to the third DC node, the fourth DC node and the gate output terminal, respectively, and wherein second terminals of the three capacitors are connected in common to serve as the source output terminal of the driving power amplification device.

* * * * *